US006342749B1

(12) United States Patent
Azima

(10) Patent No.: US 6,342,749 B1
(45) Date of Patent: Jan. 29, 2002

(54) VIBRATION EXCITER

(75) Inventor: Henry Azima, Cambridge (GB)

(73) Assignee: New Transducers Limited, London (GB)

( * ) Notice: Subject to any disclaimer, the term of this patent is extended or adjusted under 35 U.S.C. 154(b) by 0 days.

(21) Appl. No.: 09/561,344

(22) Filed: Apr. 28, 2000

Related U.S. Application Data

(60) Provisional application No. 60/150,588, filed on Aug. 26, 1999.

(30) Foreign Application Priority Data

Apr. 29, 1999 (GB) ............................................. 9910216

(51) Int. Cl.[7] ................................................ H01L 41/08

(52) U.S. Cl. ....................... 310/321; 310/322; 310/329; 310/371

(58) Field of Search ........................... 310/321, 323.01, 310/366, 368, 369, 370, 371, 330, 328, 322

(56) References Cited

U.S. PATENT DOCUMENTS 4,654,554 A 3/1987 Kishi ......................... 381/158
5,309,519 A 5/1994 Park et al. .................. 381/190
5,589,725 A * 12/1996 Maertling ................... 310/371
5,629,483 A * 5/1997 Nakamura et al. ...... 310/321 X
5,736,808 A * 4/1998 Szilagyi et al. ............. 310/322
5,780,958 A * 7/1998 Strugach et al. ............ 310/348
5,804,906 A * 9/1998 Tsutsumi .................... 310/322
5,828,157 A * 10/1998 Miki et al. .................. 310/328
6,150,752 A * 11/2000 Bishop ....................... 310/328

FOREIGN PATENT DOCUMENTS

EP 0 871 345 10/1998

OTHER PUBLICATIONS

Patent Abstracts of Japan, JP 58 019099, vol. 007, No. 094 (E–171), Apr. 20, 1983.

* cited by examiner

*Primary Examiner*—Mark O. Budd
(74) *Attorney, Agent, or Firm*—Foley & Lardner

(57) ABSTRACT

A curved piezoelectric device is attached to a plate to vibrate the plate. Mass-loading is applied to at least one free end of the piezoelectric device to increase output.

4 Claims, 2 Drawing Sheets

VIBRATION EXCITER

This application claims the benefit of provisional application No. 60/150,588, filed Aug. 26, 1999.

BACKGROUND

The invention relates to piezoelectric vibration exciters, e.g. of the kind which may be used to apply ending wave energy to resonant panels to form loudspeakers, and to panel-form loudspeakers employing such exciters. Our International patent application WO97/09842, and counterpart U.S. application Ser. No. 08/707,012, filed Sep. 3, 1996, describe such resonant panel loudspeakers and vibration exciters therefor. The latter application is incorporated herein by reference in its entirety.

Conventional piezoelectric actuators exhibit limited mechanical displacement. The output of conventional piezoelectric devices is limited by the materials' basically low piezoelectric displacement constant. Thus conventional devices of reasonable thickness (i.e. of the order of a few millimetres) offer only micrometer-sized mechanical output motion.

Many attempts have been made to provide piezoelectric devices having increased mechanical output displacement. "Rainbow" actuators, "Moonies,"unimorphic and bimorphic piezoelectric actuators exhibit greater mechanical output motion. However, even the thinnest ceramic wafers, which exhibit the maximum observed output motion, provide a displacement limited to approximately 1 mm of motion in the z-axis direction for a device that is 3–4 cm long. Additionally, 0.25 mm thick ceramic devices are extremely brittle and fragile so that they are prone to breakage and require special handling. U.S. Pat. Nos. 5,632,841 and 5,802,195 and International application WO96/31333 describe high displacement ferro-electric devices.

SUMMARY OF THE INVENTION

It is an object of the invention to provide a piezoelectric device of enhanced output.

According to the invention there is provided a vibration exciter comprising a curved piezoelectric device having an attachment portion at which the device is to be attached to a substrate to be vibrated and at least one free portion remote from the attachment portion, and a mass load provided on at least one of the or each free portion.

The piezoelectric device may be a ferro-electric device and may be pre-stressed. Mass loading such pre-stressed ferroelectric devices may provide a surprisingly large increase in output, of around an order of magnitude, when the devices are used to drive resonant bending wave panels.

The device may be arcuate in shape or may be a generally circular dished device.

From another aspect the invention is a resonant panel-form loudspeaker driven in resonance by a vibration exciter as described above.

BRIEF DESCRIPTION OF THE DRAWING

Examples which embody the best mode for carrying out the invention are described in detail below and are diagrammatically illustrated in the accompanying drawing, in which.

DETAILED DESCRIPTION

Figure 1:
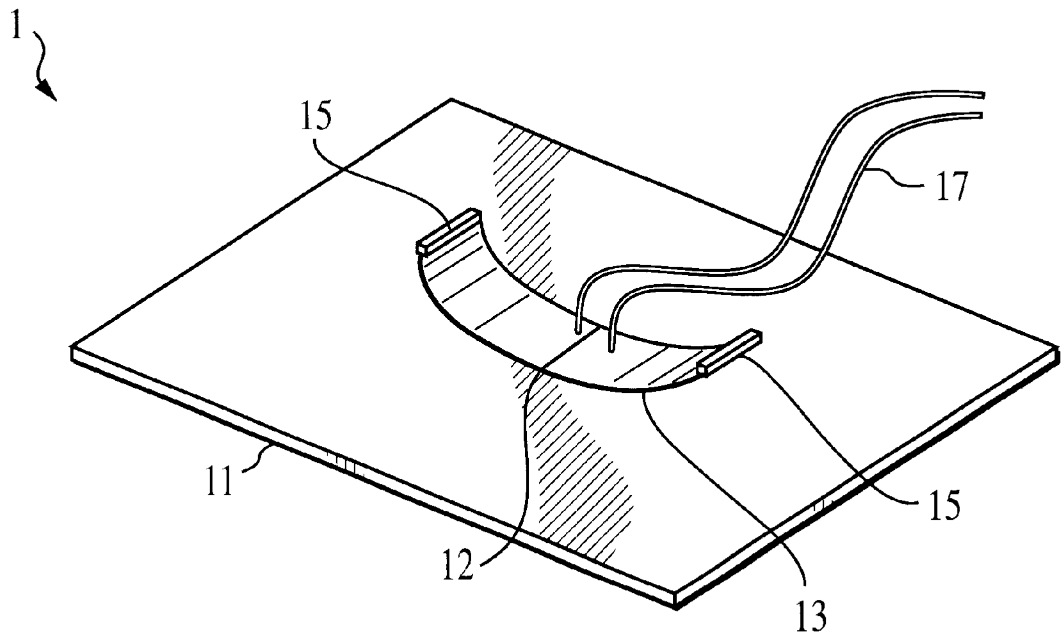
FIG. 1 is a perspective view showing a first embodiment of a piezoelectric device according to the invention.

Referring to FIG. 1, a loudspeaker 1 comprises a plate 11 capable of supporting resonant bending wave modes, as set out in WO97/09842 and U.S. Ser. No. 08/707,012. A curved, composite piezoelectric device 13, such as described in U.S. Pat. No. 5,632,841, has an attachment portion 12 centrally located on the piezoelectric device. The attachment portion 12 is mounted at a preferred, off-centre location on the panel 11, preferably in accordance with the teachings of WO97/09842 and U.S. Ser. No. 08/707,012. The ends 14 of the device are free. At each end of the piezoelectric device 13 an elongated mass 15 is provided along the end of the device to mass-load the piezoelectric vibration exciter to increase the output of the exciter. Leads 17 provide an electrical signal to the exciter.

Figure 2:
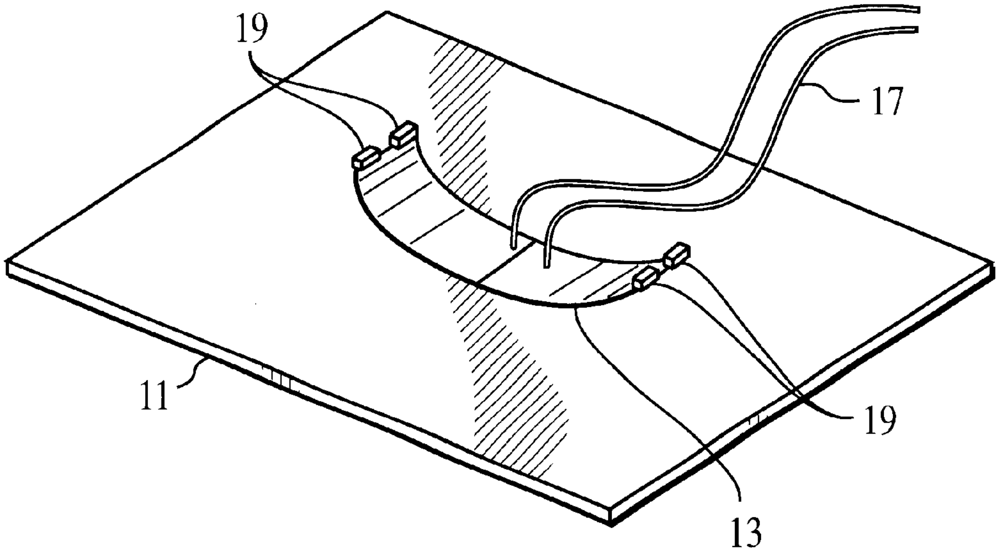
FIG. 2 is a perspective view showing a second embodiment of the invention.

FIG. 2 shows a similar arrangement except that instead of a single mass 15, a pair of shorter masses 19 are provided at each end of the piezoelectric vibration exciter 13.

Figure 3:
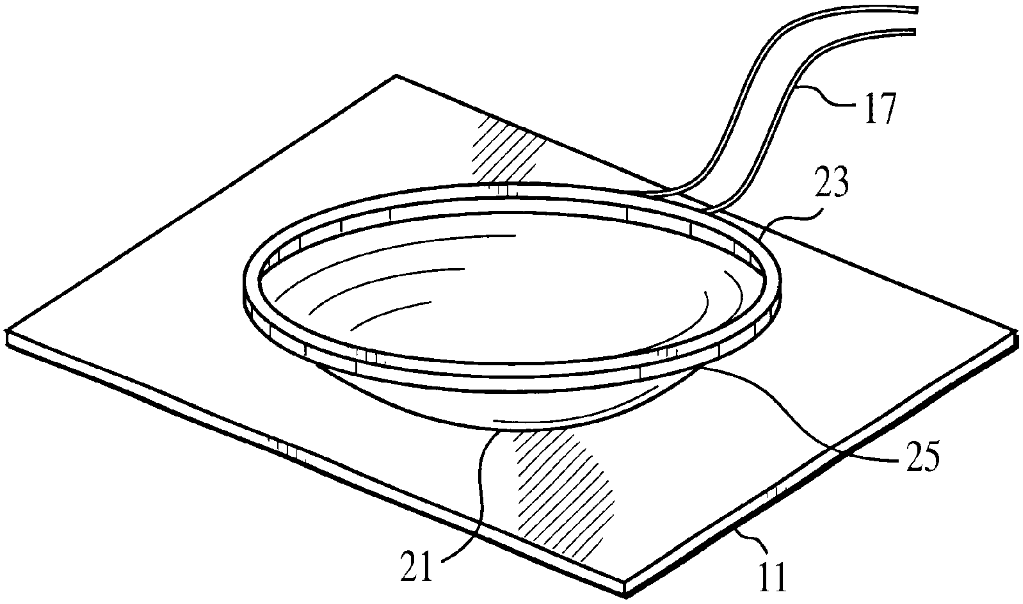
FIG. 3 is a perspective view showing a third embodiment of the invention.

In FIG. 3, the piezoelectric vibration exciter 21 is genuinely circular and dish-shaped, attached to the panel at the centre of the dish, with a single elongated mass 23 provided on the free peripheral rim 25 of the exciter. The mass 23 mass-loads the piezoelectric vibration exciter to increase the output of the exciter.

Figure 4:
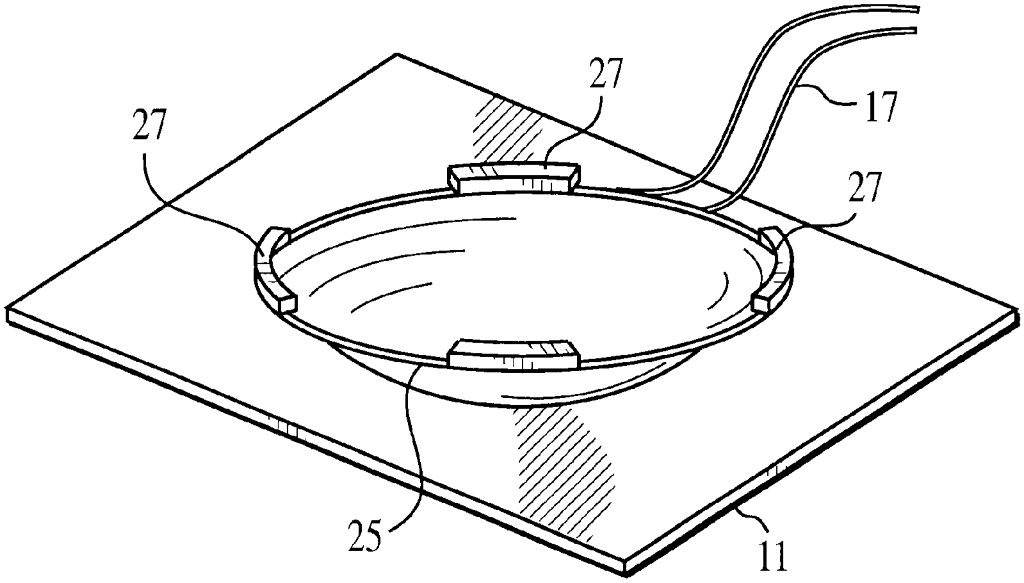
FIG. 4 is a perspective view showing a fourth embodiment of the invention.

FIG. 4 shows an alternative arrangement in which the continuous ring 23 of FIG. 3 is replaced by a plurality of discrete masses 27, symmetrically arranged the rim 25 of the piezoelectric device.

The invention thus provides a simple way of increasing the output of an exciter.

What is claimed is:

1. A vibration exciter comprising:

an arcuate piezoelectric device having an attachment portion at which the device is adapted to be attached to a substrate to be vibrated and at least one free portion remote from the attachment portion, and a mass load on said at least one free portion, wherein said at least one free portion comprises two free ends, and said mass load comprises plural masses on each of said ends.

2. A vibration exciter comprising:

a dish-shaped piezoelectric device having an attachment portion at which the device is adapted to be attached to a substrate to be vibrated and at least one free portion remote from the attachment portion, and a mass load on said at least one free portion, wherein said mass load comprises a plurality of masses at spaced locations on the periphery of the dish.

3. A loudspeaker comprising:

a diaphragm capable of vibration to produce sound, an arcuate piezoelectric device having an attachment portion mounted to the diaphragm and at least one free portion remote from the attachment portion and spaced from the diaphragm, and a mass load on said at least one free portion, wherein said at least one free portion comprises two free ends, and said mass load comprises plural masses on each of said ends.

4. A loudspeaker comprising:

a diaphragm capable of vibration to produce sound, a dish-shaped piezoelectric device having an attachment portion mounted to the diaphragm and at least one free portion remote from the attachment portion and spaced from the diaphragm, and a mass load on said at least one free portion, wherein said mass load comprises a plurality of masses at spaced locations on the periphery of the dish.

* * * * *